United States Patent
Park et al.

(10) Patent No.: US 8,482,691 B2
(45) Date of Patent: Jul. 9, 2013

(54) DISPLAY APPARATUS HAVING A MINIMIZED NON-DISPLAY REGION

(75) Inventors: Sang-Don Park, Pyeongtaek-si (KR); Soon-Hyung Kwon, Pyeongtaek-si (KR); Seung-Gyu Lee, Pyeongtaek-si (KR); Deog-Jin Lee, Pyeongtaek-si (KR)

(73) Assignee: LG Electronics Inc., Seoul (KR)

( * ) Notice: Subject to any disclaimer, the term of this patent is extended or adjusted under 35 U.S.C. 154(b) by 670 days.

(21) Appl. No.: 12/630,064

(22) Filed: Dec. 3, 2009

(65) Prior Publication Data

US 2010/0246104 A1    Sep. 30, 2010

(30) Foreign Application Priority Data

Mar. 31, 2009  (KR) .................. 10-2009-0027698

(51) Int. Cl.
*G02F 1/1333*    (2006.01)
(52) U.S. Cl.
USPC .................................. 349/58; 349/59; 349/60
(58) Field of Classification Search
USPC .................................. 349/58–60, 117; 353/81
See application file for complete search history.

(56) References Cited

U.S. PATENT DOCUMENTS

| | | | |
|---|---|---|---|
| 5,061,052 A | 10/1991 | DeJesus | |
| 5,400,177 A | 3/1995 | Petitto et al. | |
| 5,739,880 A | 4/1998 | Suzuki et al. | |
| 5,828,410 A | 10/1998 | Drapeau | |
| 6,276,803 B1 * | 8/2001 | Aoyama et al. | 353/81 |
| 6,313,946 B1 | 11/2001 | Petitto et al. | |
| 6,919,678 B2 | 7/2005 | Ozolins et al. | |
| 7,222,969 B2 | 5/2007 | Veligdan | |
| 7,223,009 B2 | 5/2007 | Henriet et al. | |
| 7,298,076 B2 | 11/2007 | Ozolins et al. | |
| 7,551,372 B2 | 6/2009 | Xun et al. | |
| 7,567,380 B2 | 7/2009 | Peterson et al. | |
| 7,719,745 B2 | 5/2010 | Yamada | |
| 2002/0118339 A1 | 8/2002 | Lowe | |
| 2003/0048400 A1 * | 3/2003 | Kim et al. | 349/117 |

(Continued)

FOREIGN PATENT DOCUMENTS

| | | |
|---|---|---|
| JP | 2000-295483 | 10/2000 |
| JP | 2003-215304 | 7/2003 |

(Continued)

OTHER PUBLICATIONS

U.S. Office Action issued in U.S. Appl. No. 12/575,239 dated Dec. 7, 2011.

(Continued)

*Primary Examiner* — Huyen Ngo
(74) *Attorney, Agent, or Firm* — KED & Associates LLP

(57) ABSTRACT

A display apparatus is provided. The display apparatus may include a display module that outputs an image, a front panel provided at a front side of the display module, a shield layer positioned at a rear side of the front panel, a back cover coupled to the rear side of the front panel, and first and second optical refractors provided on a rear side of the front panel. The first optical refractor may overlap an outer edge of the shield layer and the second optical refractor may overlap an inner edge of the shield layer. This arrangement may minimize the visible portion of a shield member provided in the display apparatus, and may increase an image display region of the display apparatus.

25 Claims, 17 Drawing Sheets

U.S. PATENT DOCUMENTS

| | | | |
|---|---|---|---|
| 2003/0231144 A1* | 12/2003 | Cho et al. ..................... 345/1.3 |
| 2006/0158579 A1 | 7/2006 | Hasegawa |
| 2006/0198033 A1 | 9/2006 | Soyama et al. |
| 2007/0103854 A1 | 5/2007 | Yu et al. |
| 2007/0291203 A1 | 12/2007 | Nakahara et al. |
| 2009/0109366 A1 | 4/2009 | Lippey |
| 2009/0231524 A1 | 9/2009 | Tanaka |
| 2009/0322982 A1 | 12/2009 | Finnegan |
| 2010/0097447 A1 | 4/2010 | Tomisawa et al. |
| 2010/0232026 A1 | 9/2010 | Park et al. |
| 2010/0232027 A1 | 9/2010 | Park et al. |
| 2010/0246104 A1 | 9/2010 | Park et al. |
| 2010/0259827 A1 | 10/2010 | Lee et al. |
| 2010/0259828 A1 | 10/2010 | Byeon et al. |
| 2010/0259829 A1 | 10/2010 | Kim et al. |
| 2010/0315570 A1 | 12/2010 | Mathew et al. |
| 2011/0007398 A1 | 1/2011 | Lim et al. |
| 2011/0013346 A1 | 1/2011 | Ju et al. |

FOREIGN PATENT DOCUMENTS

| | | |
|---|---|---|
| JP | 2004-029220 | 1/2004 |
| JP | 2005-166811 | 6/2005 |
| JP | 2005-242265 | 9/2005 |
| JP | 2005-257794 | 9/2005 |
| JP | 2005-354474 | 12/2005 |
| JP | 2006-047271 | 2/2006 |
| JP | 2006-073545 | 3/2006 |
| JP | 2006-128421 | 5/2006 |
| JP | 2006-179683 | 7/2006 |
| JP | 2008-209764 | 9/2008 |
| JP | 2011-123406 | 6/2011 |
| KR | 10-0817560 | 3/2008 |
| KR | 10-0841318 | 6/2008 |
| KR | 10-2008-0106604 | 12/2008 |
| WO | WO 02/27399 | 4/2002 |
| WO | WO 2010/055565 | 5/2010 |

OTHER PUBLICATIONS

U.S. Office Action issued in U.S. Appl. No. 12/575,313 dated Dec. 27, 2011.

Office Action issued in U.S. Appl. No. 12/630,038 dated Feb. 3, 2011.

Office Action issued in U.S. Appl. No. 12/630,026 dated Mar. 21, 2011.

Office Action issued in U.S. Appl. No. 12/630,009 dated Apr. 5, 2011.

International Search Report issued in PCT/KR2008/005633 dated Mar. 22, 2010.

International Search Report issued in PCT/KR2008/005635 dated Mar. 22, 2010.

Notice of Allowance issued in U.S. Appl. No. 12/630,009 dated May 16, 2011.

U.S. Office Action issued in U.S. Appl. No. 12/575,239 dated Jun. 28, 2011.

International Search Report issued in PCT/KR2009/005274 dated May 26, 2010.

U.S. Appl. No. 12/575,239, filed Oct. 7, 2009.

U.S. Appl. No. 12/575,313, filed Oct. 7, 2009.

U.S. Appl. No. 12/575,349, filed Oct. 7, 2009.

U.S. Appl. No. 12/630,009, filed Dec. 3, 2009.

U.S. Appl. No. 12/630,026, filed Dec. 3, 2009.

U.S. Appl. No. 12/630,038, filed Dec. 3, 2009.

Final Office Action issued in U.S. Appl. No. 12/575,313 dated Aug. 30, 2012.

International Search Report issued in PCT/KR2009/005272 dated May 18, 2010.

Non-Final Office Action issued in U.S. Appl. No. 12/575,313, dated Aug. 30, 2012.

* cited by examiner

DISPLAY APPARATUS HAVING A MINIMIZED NON-DISPLAY REGION

CROSS-REFERENCE TO RELATED APPLICATIONS

This claims priority under 35 U.S.C. 119 and 35 U.S.C. 365 to Korean Patent Application No. 10-2009-0027698 (filed in Korea on Mar. 31, 2009), the entirety of which is incorporated herein by reference.

BACKGROUND

1. Field

The present disclosure relates to a display apparatus.

2. Background

Generally, a display apparatus, such as for example, a television or a computer monitor, displays still or moving images. High-definition, large-scale display apparatuses such as, for example, liquid crystal displays (LCDs) and plasma display panels (PDPs), may provide improved display characteristics. It would be desirable to reduce the width of a front edge portion of such a display, on which an image is not displayed, so as to increase screen size without increasing the overall size of the display module.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Reference will now be made to various embodiments, examples of which are illustrated in the accompanying drawings.

Figure 1:
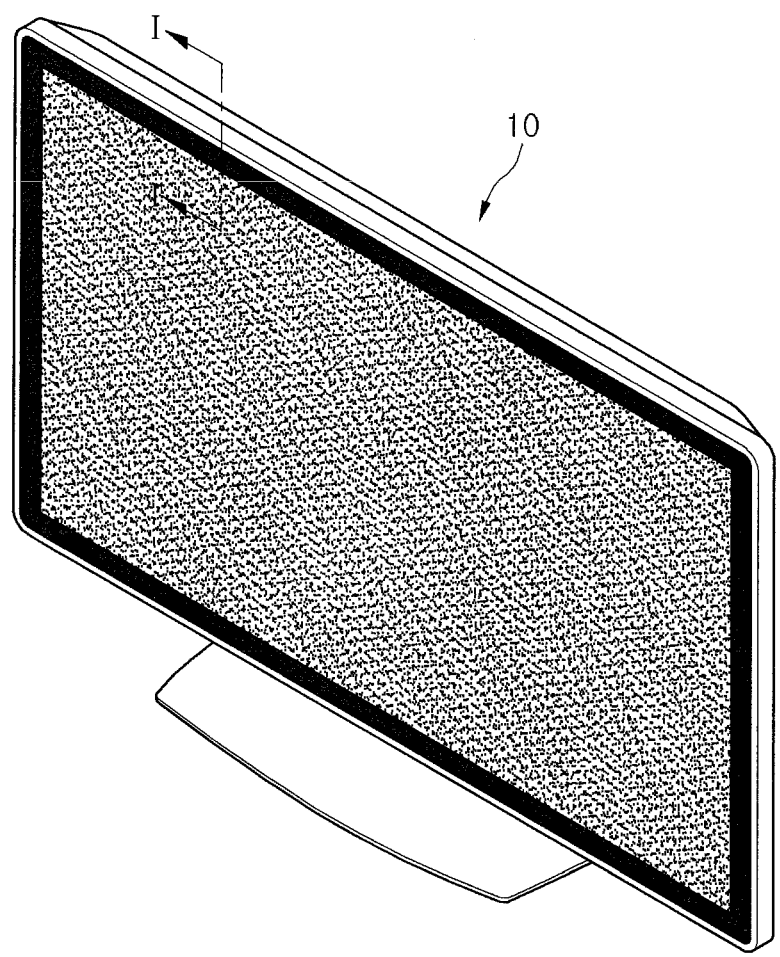
FIG. 1 is a front perspective view of a display apparatus according to an embodiment as broadly described herein.
Figure 2:
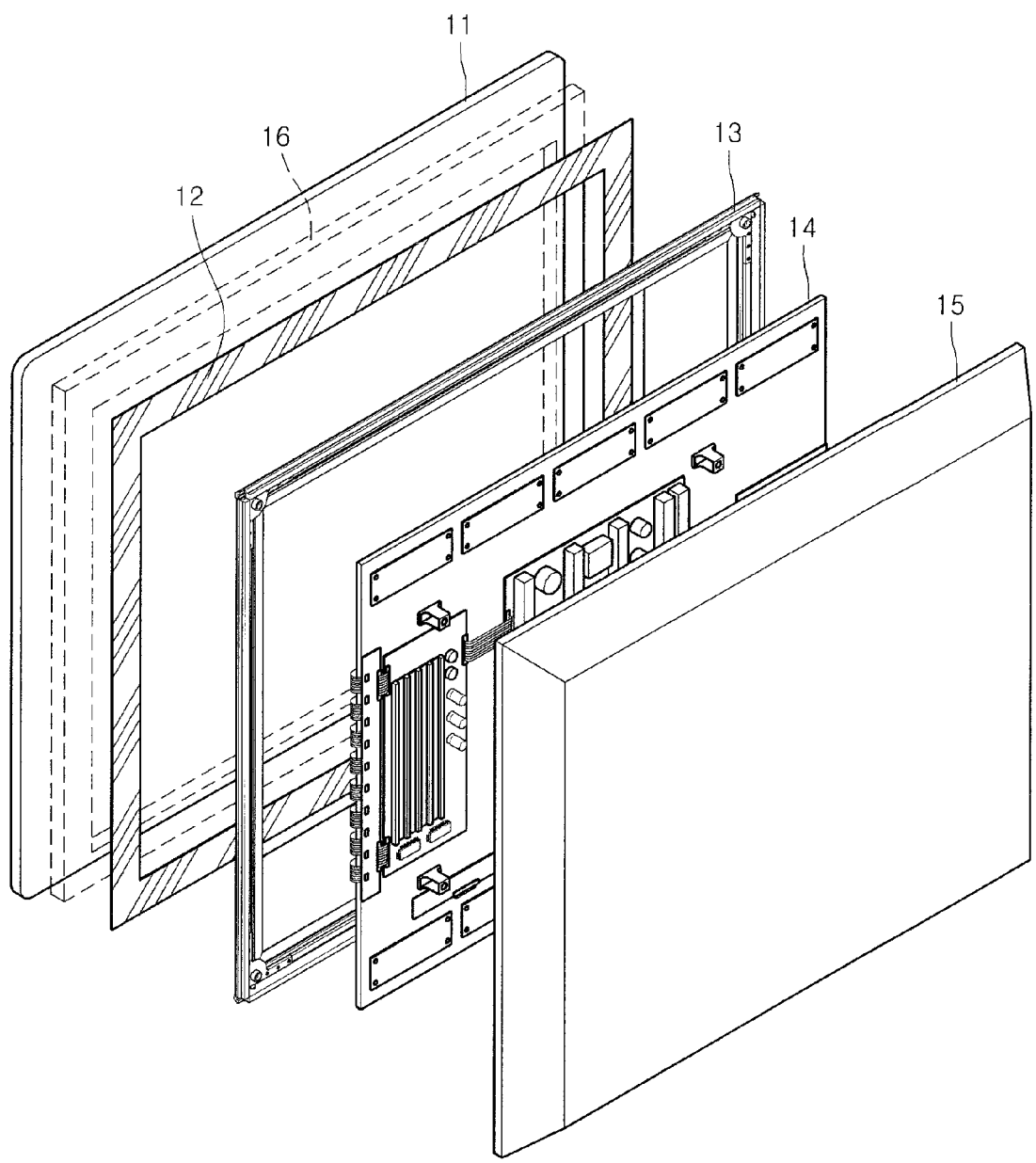
FIG. 2 is an exploded rear perspective view of the display apparatus shown in FIG. 1.
Figure 3:
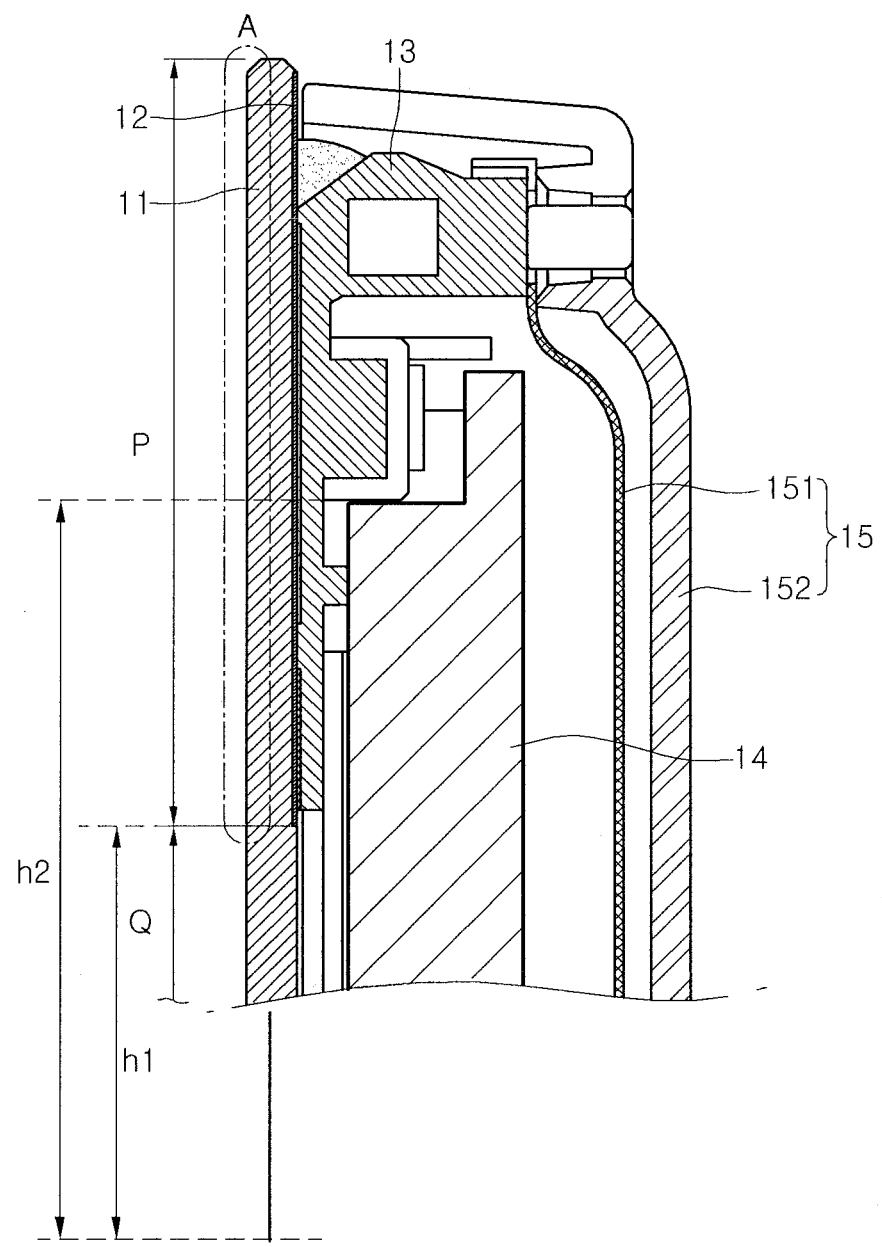
FIG. 3 is a side sectional view taken along line I-I' of FIG. 1.

The exemplary display apparatus 10 shown in FIGS. 1 to 3 may include a display module such as, for example, a thin flat panel display module, which may include, for example, liquid crystal display (LCD), a plasma display panel (PDP), an organic light emitting device (OLED), or any other display module capable of displaying images as appropriate.

The display apparatus 10 may include a display module 14 configured to display images, a transparent front panel 11 disposed at the front side of the display module 14, a supporting member 13 that fixes the display module 14 to the rear side of the front panel 11, a back cover 15 configured to cover and protect the supporting member 13 and the display module 14, and a shield member 12 configured to cover edges of the back cover 15, the front surface of the supporting member 13, and edge portions of the display module 14 so as to prevent these elements from being seen by a viewer through the front panel 11.

In certain embodiments, the back cover 15 may include inner and outer cover members 151 and 152 as shown in FIG. 3. In alternative embodiments, the back cover 15 may include a single cover member. The shield member 12 may be an opaque thin sheet capable of blocking light, such as, for example, a black film. A region through which an image signal cannot be transmitted due to the shield member 12 may be referred to as a 'bezel'. As shown in FIG. 2, the shield member 12 may have a rectangular strip shape having a predetermined width corresponding to the edges of the front panel 11.

As shown in FIG. 3, the shield member 12 may be attached to the rear side of the front panel 11 by an adhesive member or other means as appropriate. In alternative embodiments, the shield member 12 may be spaced apart from the rear side of the front panel 11, or may be attached to the front side of an assembly of the display module 14 and the supporting member 13, and then, the assembly may be coupled to the rear side of the front panel 11 by using an additional coupling part 16 that maintains the assembly spaced apart from the rear side of the front panel 11. If the shield member 12 is spaced apart from the rear side of the front panel 11, the shield member 12 may appear narrower than its actual size when viewed through the front panel.

The additional coupling part 16 may have a rectangular strip shape having a predetermined width and thickness correspond to the supporting member 13 or the shield member 12. The additional coupling part 16 may be made of a transparent material and may be adhered to the rear surface of the front panel 11 and to the front surface of the shield member 12 by a transparent adhesive. In this manner, the shield member 12 may be viewed by the user through the additional coupling part 16, so that the shield member 12 appears narrower than its actual size.

In alternative embodiments, the shield member 12 may be formed inside the front panel 11 as part of the front panel 11. As discussed above, the shield member 12 may be opaque so that light or images cannot be transmitted therethrough to the front side of the display apparatus 10. Thus, the term 'opaque' is used herein to denote a light blocking state in which a viewer cannot see an image in the region of the shield member 12 or an object or component disposed directly behind the shield member 12. The term 'opaque' is not used herein to denote complete blocking of light.

The front panel 11 may be formed of an injection-molded transparent plastic, tempered glass, or other material as appropriate. For example, the front panel 11 may be formed of a plastic such as poly carbonate (PC) or polymethylmethacrylate (PMMA).

The supporting member 13 may be brought into contact with the rear side of the front panel 11 by a coupling part such as, for example, an adhesive member, with the supporting member 13 spaced inwardly from edges of the rear side of the front panel 11. The size of the front edge of the back cover 15 may be less than or equal to the size of the rear edge of the front panel 11 so that the edges of the back cover 15 fall within the confines of the edges of the front panel 11, so that only the front panel 11 is exposed to the viewer to make the front side of the display apparatus 10 seem bigger.

The region (A) shown in FIG. 3 is a characteristic region of the display apparatus 10. A region formed by the shield member 12 and denoted with black color may be defined as a non-display region (P), and a region that falls within the inner periphery of the shield member 12 may be defined as an image display region (Q). The inner edges of the non-display region (P) are located inward from the outer front edges of the display module 14.

In other words, the distance (h1) between the center of the display module 14 and the inner edges of the non-display region (P) is less than the distance (h2) between the center of the display module 14 and the front edges of the display module 14. Therefore, the area of the image display region (Q) is less than the area of the display module 14. However, in alternative embodiments, the inner edges of the non-display region (P) may be aligned with the front edges of the display module 14 so that the area of the image display region (Q) is substantially equal to the area of the display module 14.

Figure 4:
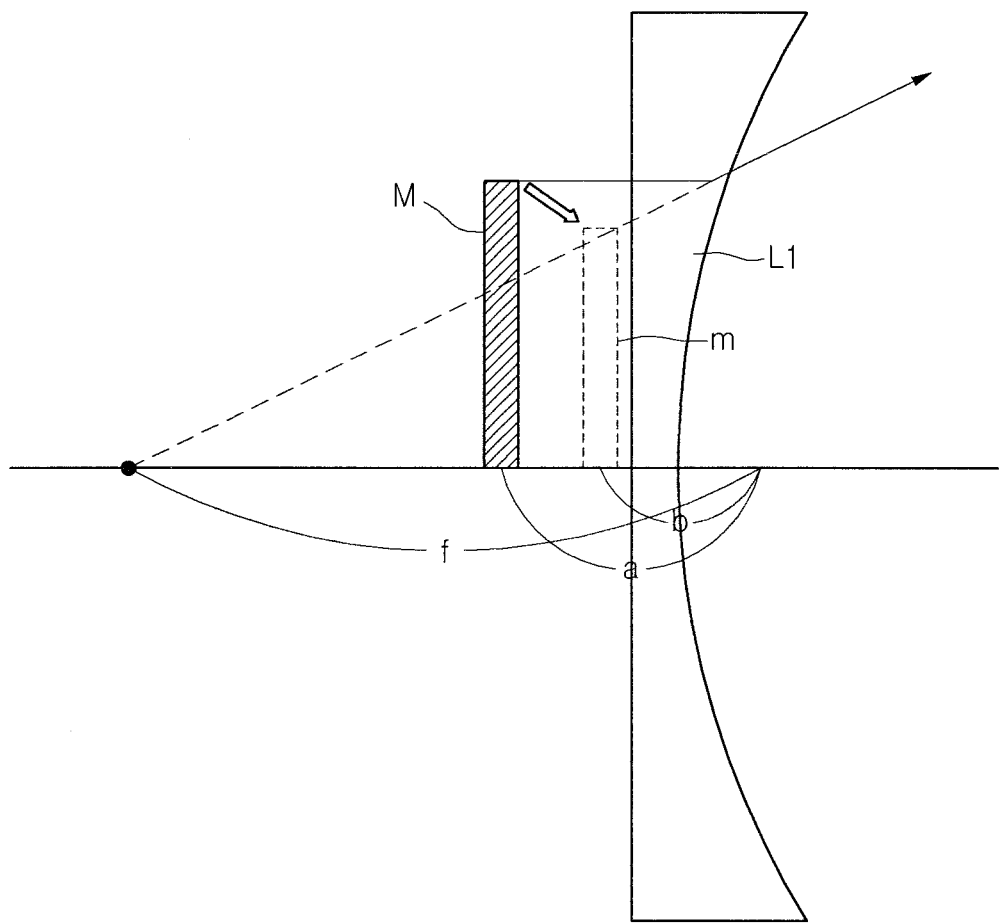
FIG. 4 illustrates the principle of a concave lens.
Figure 5:
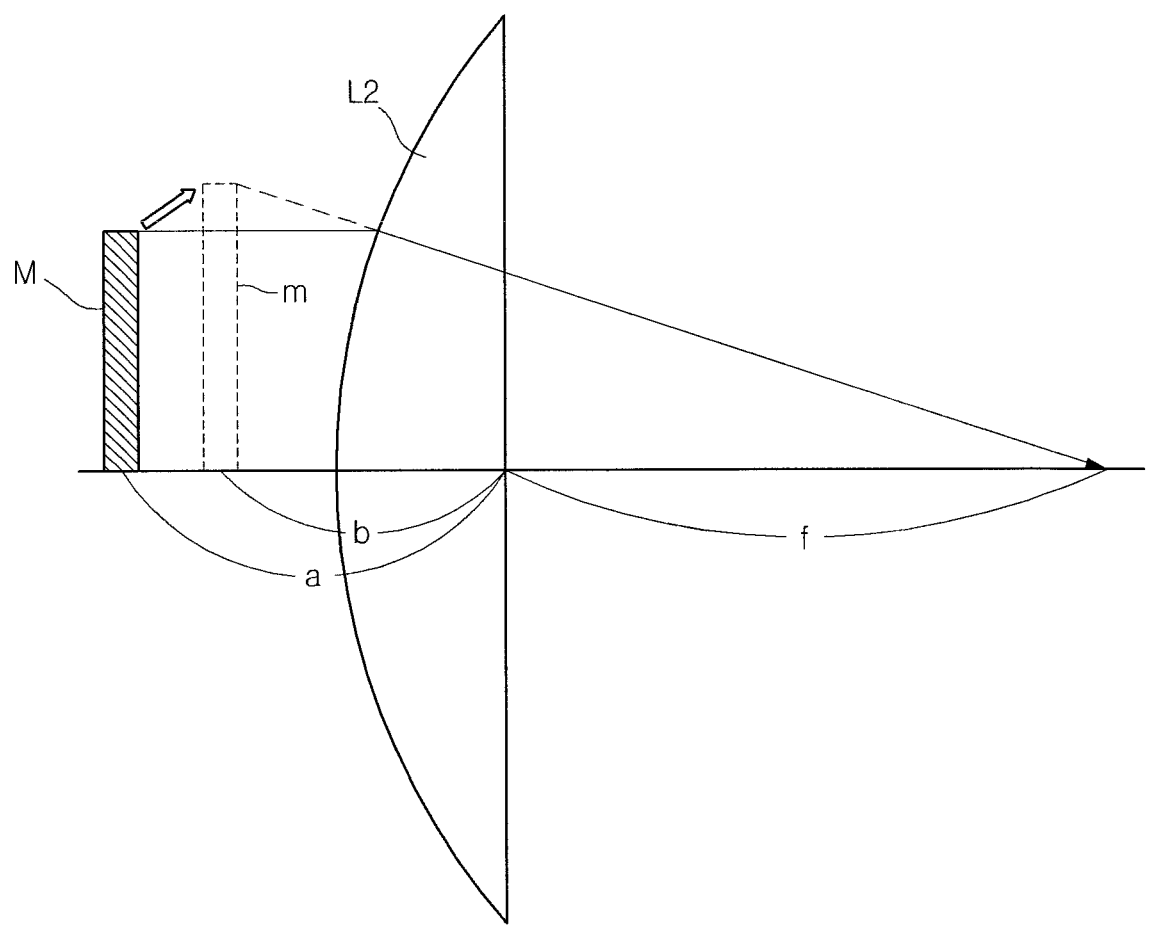
FIG. 5 illustrates the principle of a convex lens.

A brief explanation of the basic principle of lenses and how an image is focused by a lens will now be provided with reference to FIGS. 4 and 5.

As shown in FIG. 4, an object (M) is placed in front of a concave lens L1 and an image (m) of the object (M) is focused. When (f) denotes the distance (focal length) between the concave lens L1 and the focal point of the concave lens L1, (a) denotes the distance between the concave lens L1 and the object (M), and (b) denotes the distance between the concave lens L1 and the image (m) of the object (M), the following focal length equation may be applied.

$$1/a + 1/b = 1/f$$

If the object (M) is placed within the focal length (f) of the concave lens L1, an upright virtual image (m) smaller than the object (M) is formed at a position between the object (M) and the concave lens L1. Therefore, to an observer seeing the upright virtual image (m), it seems that the object (M) is smaller than its actual size. For example, a beam from the upper end of the object (M) is refracted upward as indicated by a solid-line arrow while the beam passes through the concave lens L1. In this case, an observer sees the beam as if the beam travels along an optical path indicated by a dashed-line in a state where the concave lens L1 does not exist.

As shown in FIG. 5, an object (M) is placed in front of a convex lens L2, and an image (m) of the object (M) is focused. As in FIG. 4, (f) denotes the distance (focal length) between the convex lens L2 and the focal point of the convex lens L2, (a) denotes the distance between the convex lens L2 and the object (M), and (b) denotes the distance between the convex lens L2 and the image (m) of the object (M). As with the concave lens L1, if the object (M) is placed within the focal length (f) of the convex lens L2, an upright virtual image (m) is formed. Those of ordinary skill in the related art will understand how an image is focused according to the kinds of lenses used and the position of an object. Thus, further description thereof will be omitted.

Figure 6:
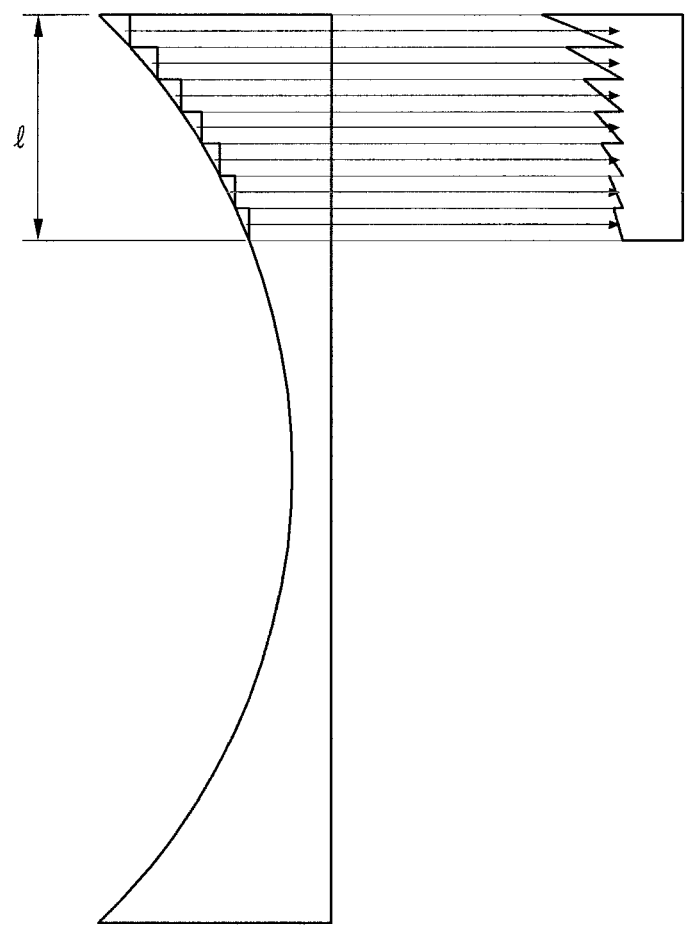
FIG. 6 illustrates an exemplary Fresnel lens according to an embodiment as broadly described herein.

FIG. 6 is a side view of an exemplary Fresnel lens which may reduce the thickness of a convex lens while providing the same function. A Fresnel lens may be fabricated by cutting an upright convex lens into a plurality of horizontal segments (parallel with the direction of an incident light beam) and moving the segments horizontally. Thereafter, the rounded refraction surface (having a convex lens profile) of each segment is flattened into a prism shape. By flattening the rounded surface of the convex lens in this way, the chromatic aberration and thickness of the Fresnel lens may be reduced. A concave Fresnel lens may be fabricated in a similar manner.

Referring to FIG. 6, an edge part of a concave lens corresponding to a region (1) may be divided into a plurality of segments. Thereafter, the rounded refraction surfaces (having a concave lens profile) of the segments may be respectively flattened into a prism shape, and the prism segments may be arranged on a plane in a row. In alternative embodiments, the prism segments may retain the same profile as the rounded refraction surface of the concave lens, and not be flattened. In the current embodiment, a prism array is formed by the plurality of prism segments arranged on a plane in a row. The refraction surfaces of the prism segments of the prism array have different oblique angles. In the embodiment shown in FIG. 6, the oblique angles of the refraction surfaces of the prism segments increase from the inside to the outside of the prism array. The oblique angles are angles measured between the refraction surfaces and a vertical plane in FIG. 6.

In this way, a concave Fresnel lens may provide the same effects as those of a corresponding concave lens, but with lower chromatic aberration caused by different wavelengths of light, and with a peripheral thickness that is less than that of the corresponding concave lens.

A concave Fresnel lens, which includes a prism array region such as the above-described prism array, may be operated according to the same principle as that of a typical concave lens. That is, light passing through the prism array region is refracted outward and diffused. If an object is placed at the left side of the concave Fresnel lens, an observer sees an upright virtual image that is smaller than the actual size of the object. An actual path of a light beam passing through the prism array region will now described.

Figure 7:
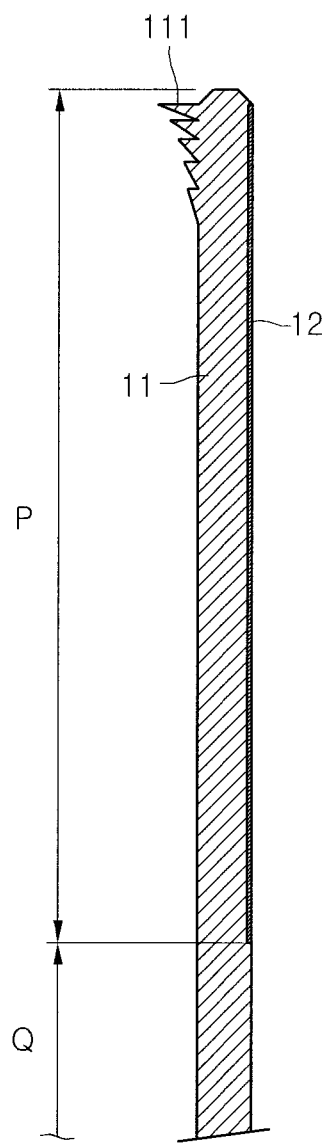
FIG. 7 is a partial sectional view of a front panel of a display apparatus according to an embodiment as broadly described herein.
Figure 8:
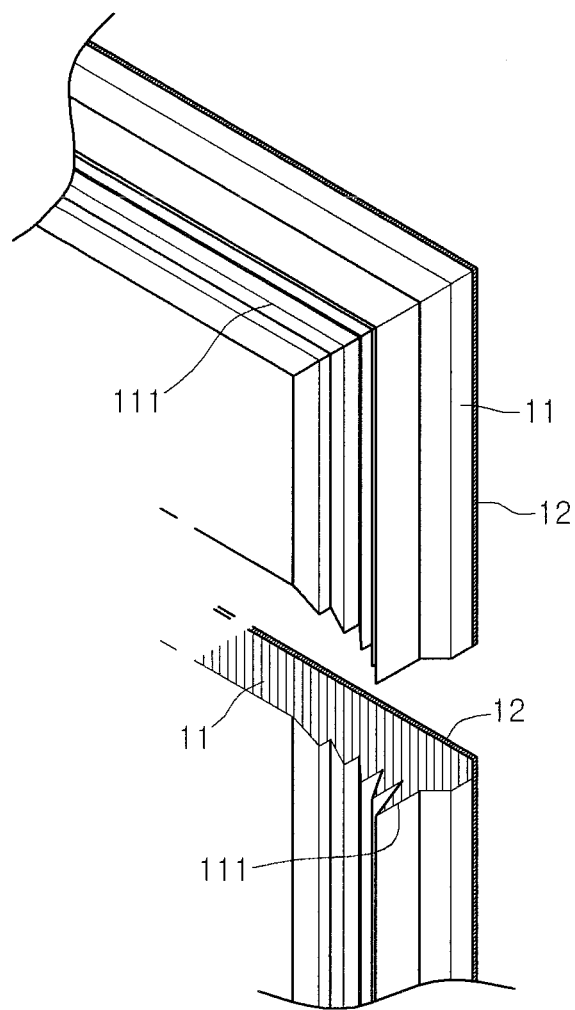
FIG. 8 is a partial perspective view of the front panel shown in FIG. 7.

In the embodiment shown in FIGS. 7 and 8, an optical path changing part 111, or refractor, is disposed at a front edge portion of a front panel 11. The optical path changing part 111, or refractor, is an optical unit configured to refract light incident on the rear side of the front panel 11 toward the front side of the front panel 11 so as to direct the light in a predetermined direction. In other words, the optical path changing part 111, or refractor, changes an optical path, so that light incident on the rear side of the front panel 11 toward the front side of the front panel 11 may be condensed to a point or diffused outwardly.

In the embodiment shown in FIGS. 7 and 8, the optical path changing part 111, or refractor, is configured to diffuse light outwardly so that a shield member 12 disposed at the rear side of the front panel 11 appears narrower than its actual size. In the embodiment shown in FIGS. 7 and 8, a prism array fabricated based on the principle of a Fresnel lens as described in FIG. 6 may be employed as an exemplary optical path changing part 111, or refractor, that is capable of changing an optical path. Therefore, in the following description, the term 'prism array' may be used to refer to the optical path changing part 111, or refractor.

A plurality of concentric ridges and grooves may be formed on the surface of a Fresnel lens. However, in the embodiment shown in FIGS. 7 and 8, a plurality of linear ridges and grooves are formed in directions parallel with edge surfaces of the front panel 11.

In more detail, as shown in FIG. 8, a linear prism array is provided at edge portions of the front panel 11, that is, at upper, lower, left, and right edge portions of the front panel 11. The width of the prism array (that is, the width of the optical path changing part 111, or refractor) may be adjusted based on how much is necessary to make the outer edge portions of a shield member 12 appear narrower. An axis, which passes through the center of curvature of a concave lens used to form the prism array, is parallel with the front side of the front panel 11 and is close to or within an image display region (Q).

The optical path changing part 111, or refractor, may be formed in a non-display region (P), and in particular, at edge portions of the front panel 11. The shield member 12 is disposed on the rear side of the front panel 11 to define the non-display region (P). In the embodiment shown in FIGS. 7 and 8, the shield member 12 is in contact with the rear side of the front panel 11. However, the shield member 12 may be spaced apart from the rear side of the front panel 11. This may be done by attaching the shield member 12 to front edge portions of a display module 14 (refer to FIG. 2) and positioning the display module 14 at a predetermined distance from the front panel 11. As the distance between the shield member 12 and the optical path changing part 111, or refractor, is increased, magnification is also increased. Therefore, since a viewer views an image of the shield member 12 that is smaller than the actual size of the shield member 12, the shield member 12 appears narrower to the viewer.

In FIGS. 7 and 8, the optical path changing part 111, or refractor, has a shape (an embossed shape) that protrudes from the front side of the front panel 11. However, the optical path changing part 111, or refractor, may be formed on the front side of the front panel 11 in a groove shape (an engraved shape). That is, the non-display region (P) of the front panel 11 and the front end of the optical path changing part 111, or refractor, may be placed on the same plane. The optical path changing part 111, or refractor, may be formed as part of the front panel 11 (that is, the optical path changing part 111, or refractor, and the front panel 11 may be formed in one piece), or the optical path changing part 111, or refractor, may be provided as a separate part and attached to the front side of the front panel 11. For example, a film having the structure of the optical path changing part 111, or refractor, may be attached to the front side of the front panel 11. In alternative embodiments, an anti-reflection (AR) film (not shown) may be attached to the front side of the front panel 11 to reduce reflectance and increase transmittance of the display screen.

The manner in which the shield member 12 is imaged by the viewer's eye will now be explained for the case in which the shield member 12 is spaced apart from the rear side of the front panel 11 with reference to FIGS. 9 and 10.

In the case of a concave Fresnel lens, the size of an image of an object is reduced as the distance between the object and the concave Fresnel lens is increased. Thus, the size of an image perceived by a viewer may be adjusted based on the distance (k) between the shield member 12 and the front panel 11. That is, as the distance (k) between the shield member 12 and the front panel 11 is increased, the size of an image of the shield member 12 may be reduced.

Figure 9:
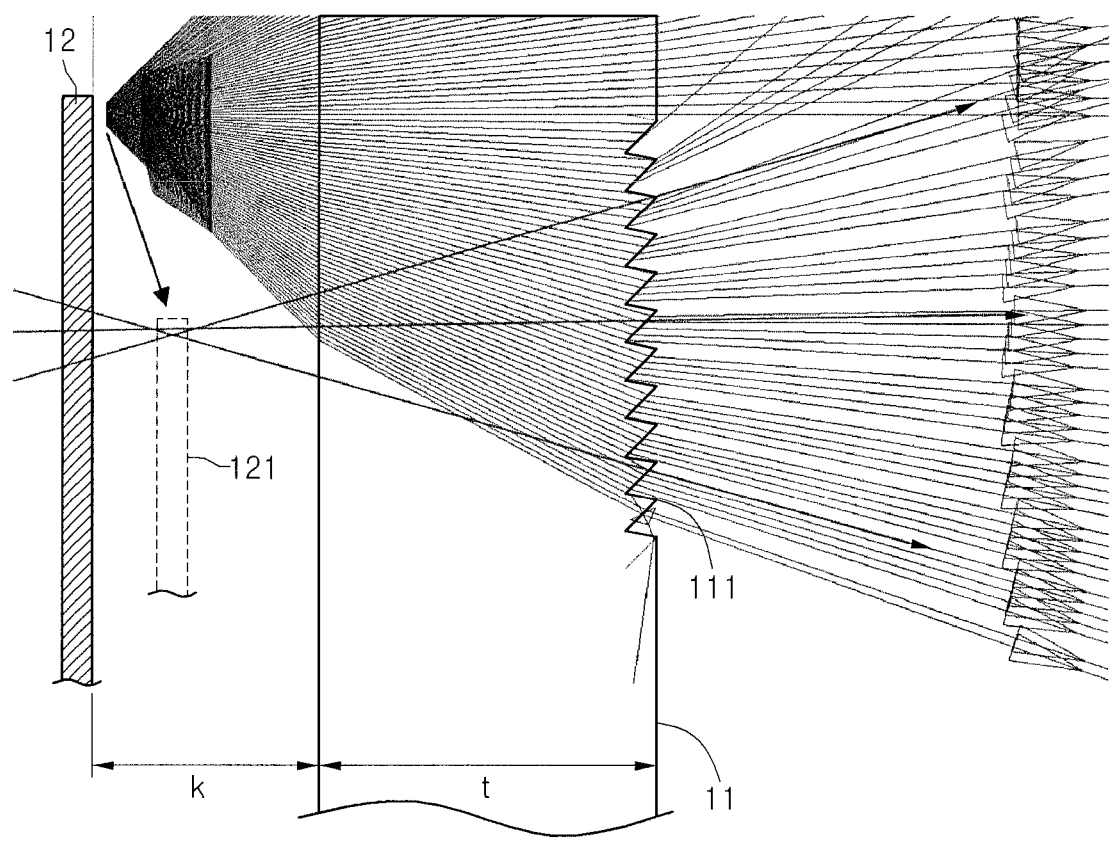
FIG. 9 illustrates an optical phenomenon at a front panel of a display apparatus that includes an optical path changing part, or refractor, according to an embodiment as broadly described herein.

In FIG. 9, optical paths of light traveling from an upper end of the shield member 12, and an image of the shield member 12 are illustrated. As shown in FIG. 9, light diverges from the upper end of the shield member 12, and the light diverging toward the front panel 11 is refracted as it enters the front panel 11. In detail, the light is refracted as it passes through an interface between different mediums (that is, the interface between air and the front panel 11). Then, the light is refracted again and diffused as it passes through the optical path changing part 111, or refractor, corresponding to a concave lens. Finally, a viewer sees a virtual image 121 of the shield member 12 that is smaller than the actual size of the shield member 12. As shown in FIG. 9, it seems to a viewer that the upper end of the shield member 12 is lowered. Exemplary light beams arriving at the viewer's eye are indicated by thick arrows in FIG. 9, and the virtual image 121 of the shield member 12 is focused on a cross point of the light beams indicated by the thick arrows. The virtual image 121 is focused between the virtual image 121 and the front panel 11.

In the embodiment shown in FIG. 9, the thickness (t) of the front panel 11 may be assumed to be fixed. Thus, the position of the upper end of the virtual image 121 may be determined by the distance (k) between the shield member 12 and the front panel 11. That is, as the distance (k) between the shield member 12 and the front panel 11 increases, the upper end of the virtual image 121 is lowered. Therefore, the width of the non-display region (P) may seem to be smaller than its actual size. As a result, the area of the image display region (Q) may appear to be larger than its actual size. In the case where the shield member 12 is in contact with the rear side of the front panel 11, it may seem that the width of the non-display region (P) is less reduced when compared to the case where the shield member 12 is spaced apart from the rear side of the front panel 11.

Figure 10:
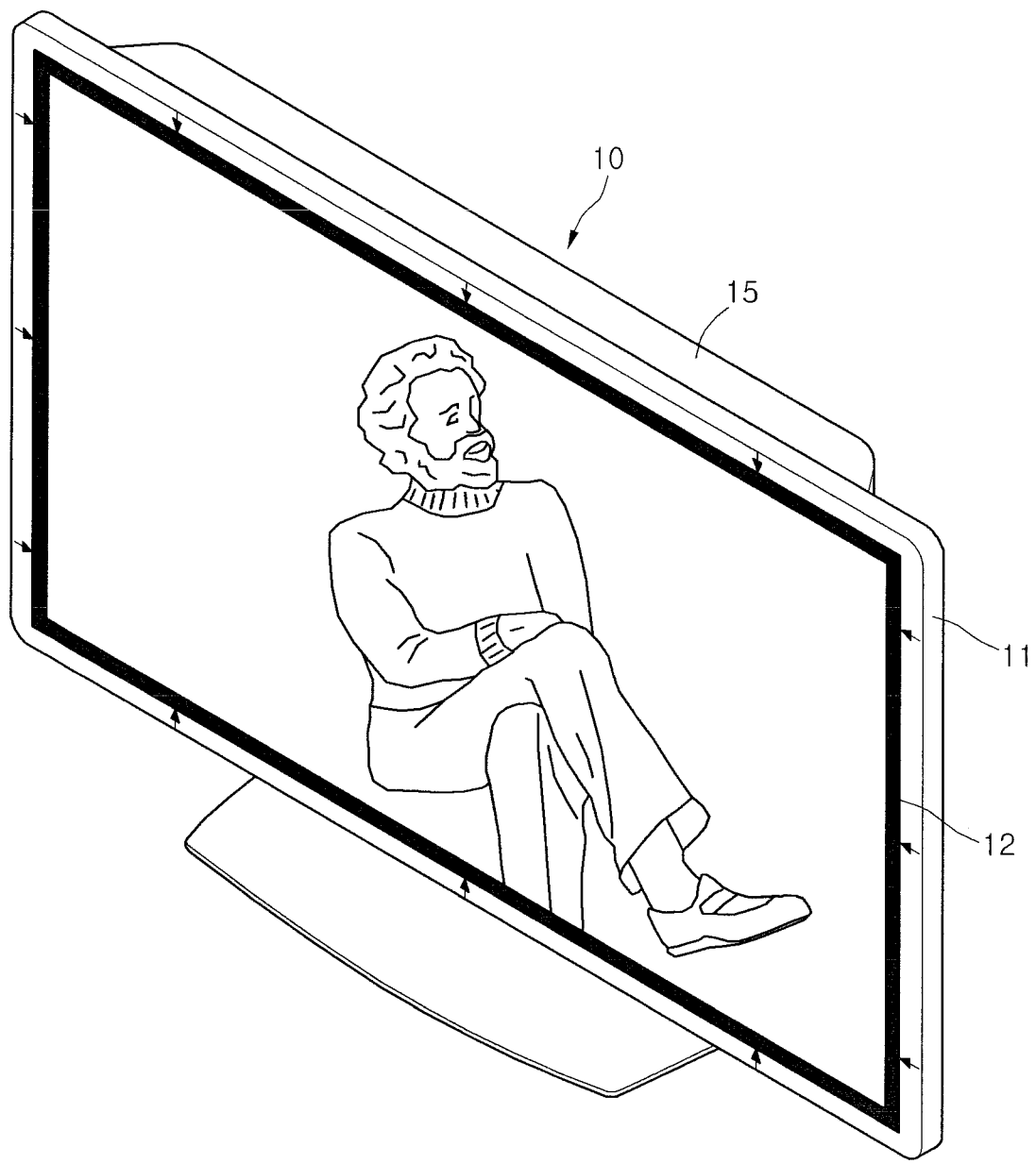
FIG. 10 is a perspective view of the display apparatus shown in FIG. 9, illustrating the front panel as viewed by a viewer.

In the embodiment shown in FIGS. 9 and 10, since the optical path changing part 111, or refractor, is formed only in regions corresponding to the outer edge portions of the shield member 12, it may seem to a viewer that the outer edge portions of the shield member 12 are moved inward toward the center of the display apparatus 10, as shown in FIG. 10.

Figure 11:
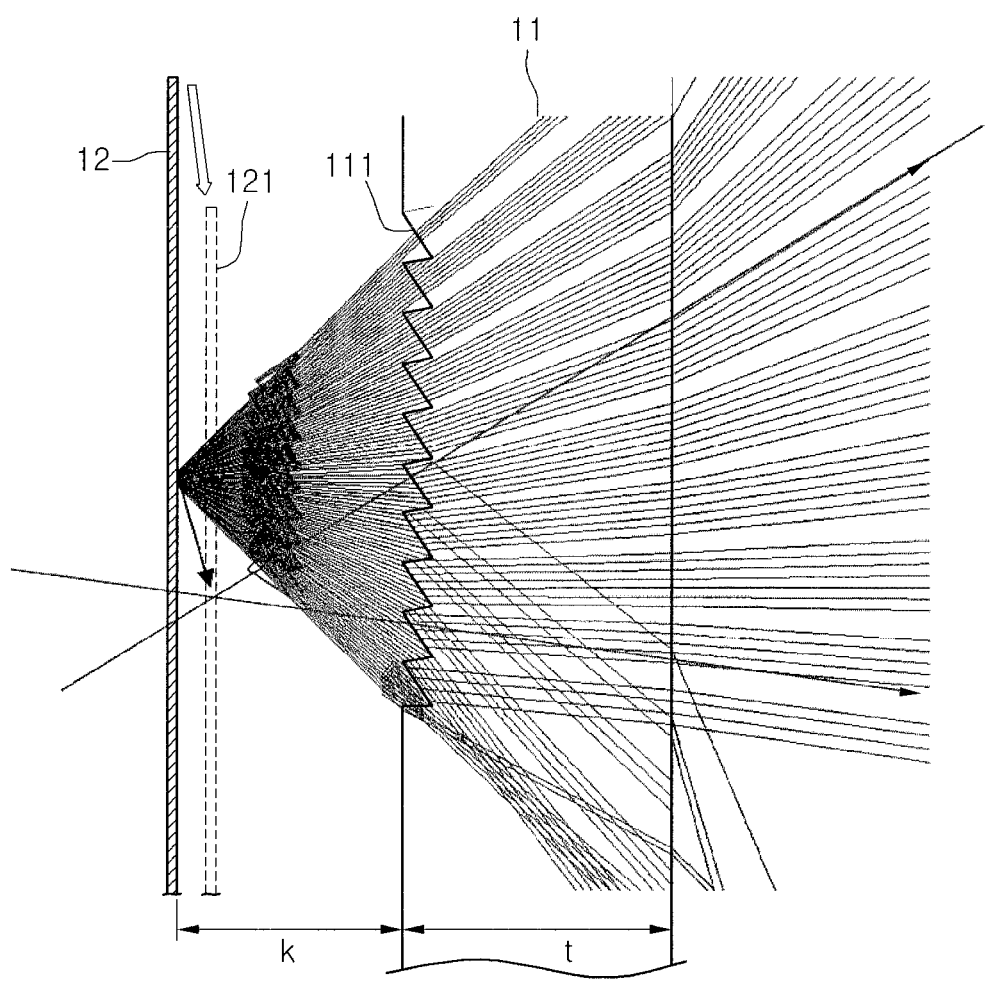
FIG. 11 illustrates an optical phenomenon at a front panel of a display apparatus that includes an optical path changing part, or refractor, according to another embodiment as broadly described herein.

Referring to FIG. 11, an optical path changing part 111, or refractor, in accordance with another embodiment as broadly described herein may be provided at the rear side of a front panel 11.

This embodiment may provide effects similar to those of the embodiment shown in FIGS. 9 and 10. However, since the optical path changing part 111, or refractor, shown in FIG. 11 is provided at the rear side of the front panel 11, the front surface of the front panel 11 that is exposed to the viewer may be smooth and flat. Therefore, the exterior of the front panel 11 may be smoother compared to the previous embodiment.

However, when the optical path changing part 111, or refractor, is provided at the rear side of the front panel 11, the distance between the optical path changing part 111 and the front panel 11 is reduced by the thickness (t) of the front panel 11 as compared with the previous embodiment. In this embodiment, if the shield member 12 is disposed in contact with the rear side of the front panel 11, a virtual image is not formed because the distance between the object and the lens is essentially zero. Therefore, in the this embodiment, the shield member 12 may be positioned spaced apart from the rear side of the front panel 11, as shown in FIG. 11.

Figure 12:
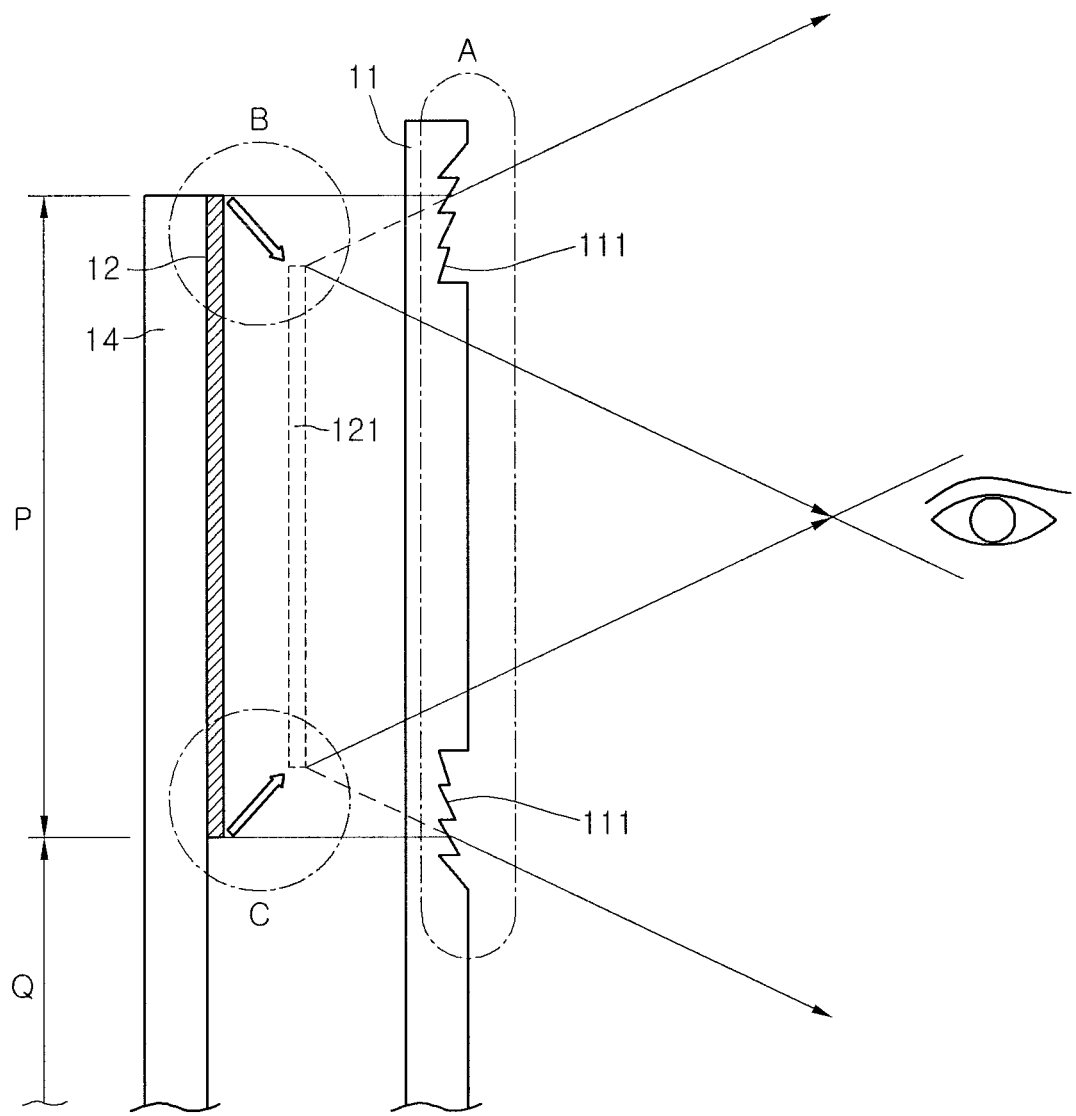
FIG. 12 illustrates an optical phenomenon at a front panel of a display apparatus that includes optical path changing parts, or refractors, according to another embodiment as broadly described herein.
Figure 13:
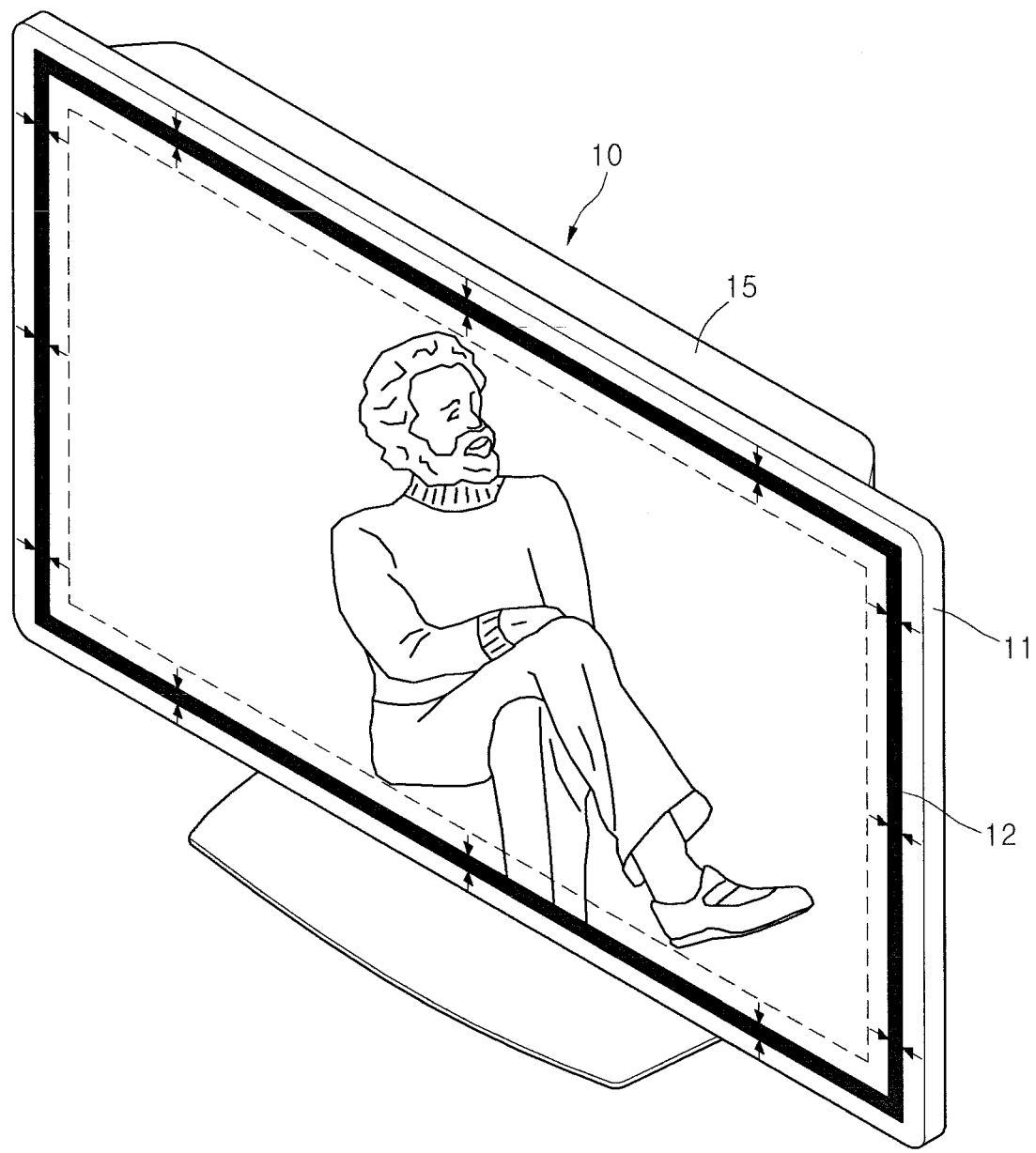
FIG. 13 is a perspective view of the display apparatus shown in FIG. 12, illustrating the front panel as viewed by a viewer.

FIG. 12 is a schematic view of an optical phenomenon observed at a front panel of a display apparatus that includes optical path changing parts, or refractors, according to another embodiment, and FIG. 13 is a perspective view of the display apparatus, illustrating the front panel as viewed by a viewer.

Referring to FIGS. 12 and 13, optical path changing parts 111, or refractors, are respectively provided at positions corresponding to inner and outer edge regions of a shield member 12. Thus, inner and outer edges of a non-display region (P) may appear to be reduced in size.

Unlike the previous embodiments, in the embodiment shown in FIG. 12, optical paths pass by both the outer and inner edges of the shield member 12, as indicated by the arrows.

In detail, the optical path changing parts 111, or refractors, may be provided on the front side of the front panel 11 in the form of a prism array, at positions corresponding to an outer edge region (B) and an inner edge region (C) of the shield member 12. The optical path changing parts 111, or refractors, may be provided in a front edge region (A) of the front panel 11 corresponding to the non-display region (P) (see, for example, the black region shown in FIG. 1). In the embodiment shown in FIG. 12, the shield member 12 is spaced apart from the rear side of the front panel 11.

Specifically, a front portion of a display module 14 that is aligned with the inner edge of the shield member 12 corresponds to a boundary between the non-display region (P) and the image display region (Q). In this way, since the optical path changing parts 111, or refractors, are provided at outer and inner edges of the non-display region (P), the appearance of the non-display region (P) is contracted and the appearance of the area of the image display region (Q) is increased. Therefore, it may appear to a viewer that the size of a screen of the display apparatus having optical path changing part(s), or refractor(s), as embodied and broadly described herein may be relatively large as compared with the size of a screen of a display apparatus having the same size display module, but not having such optical path changing part(s), or refractor(s). This effect is illustrated in the perspective view shown in FIG. 13.

Figure 14:
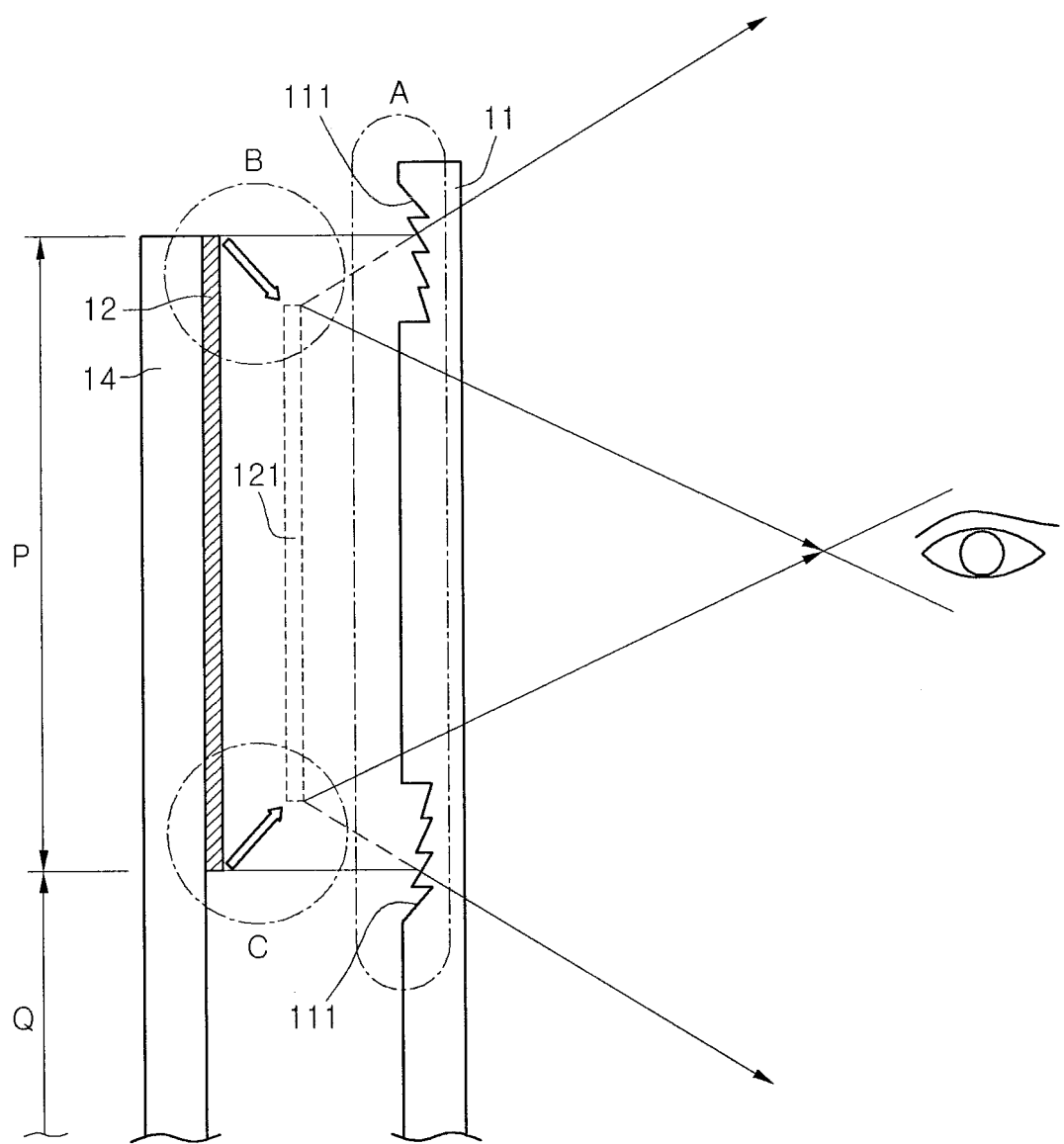
FIG. 14 illustrates an optical phenomenon at a front panel of a display apparatus that includes optical path changing parts, or refractors, according to another embodiment as broadly described herein.

FIG. 14 is a schematic view of an optical phenomenon at a front panel of a display apparatus that includes optical path changing parts, or refractors, according to another embodiment as broadly described herein. The display apparatus shown in FIG. 14 has essentially the same structure as the display apparatus shown in FIG. 12, except that, in the embodiment shown in FIG. 14, optical path changing parts 111, or refractors, are provided on the rear side of the front panel 11. In the case where the optical path changing parts 111, or refractors, are provided on the rear side of the front panel 11, the installation structure of the shield member 12 is essentially the same as that explained with respect to FIG. 11. Thus, a description thereof will be omitted.

Figure 15:
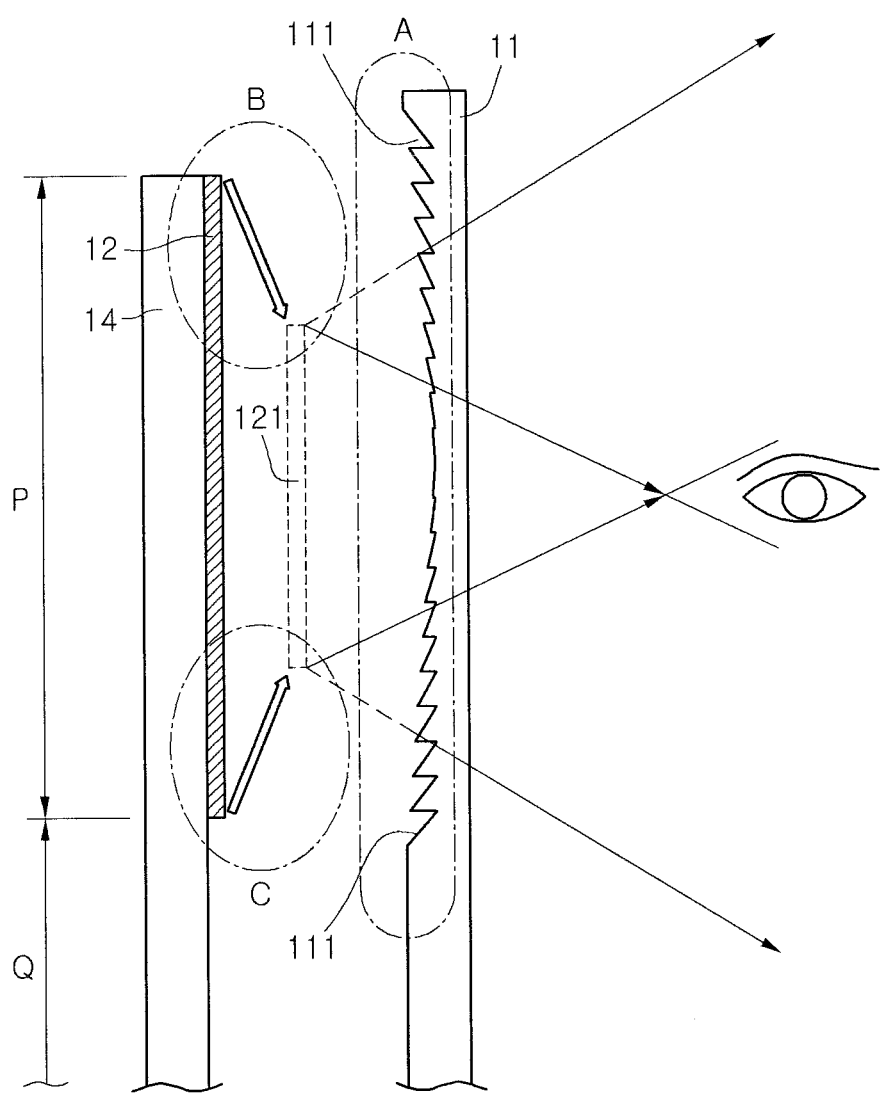
FIG. 15 illustrates an optical phenomenon at a front panel of a display apparatus that includes an optical path changing part, or refractor, according to another embodiment as broadly described herein.

FIG. 15 is a schematic view of an optical phenomenon at a front panel of a display apparatus that includes an optical path changing part, or refractor, according to another embodiment as broadly described herein. The display apparatus shown in FIG. 15 has substantially the same structure as the display apparatus shown in FIG. 14, except that, in the embodiment shown in FIG. 15, an optical path changing part 111, or refractor, is continuously formed from an outer edge region to an inner edge region of an inner side of the front panel 11 corresponding to the shield member 12.

That is, a prism array is disposed on the inner side of the front panel 11 from the outer edge region to the inner edge region of the shield member 12, and another prism array is disposed in a direction from the inner edge region to the outer edge region of the shield member 12, so that the prism arrays are symmetric and meet each other at a center portion of the shield member 12. Therefore, a virtual image 121 of the shield member 12 may be smaller when compared to the embodiment shown in FIG. 14.

Figure 16:
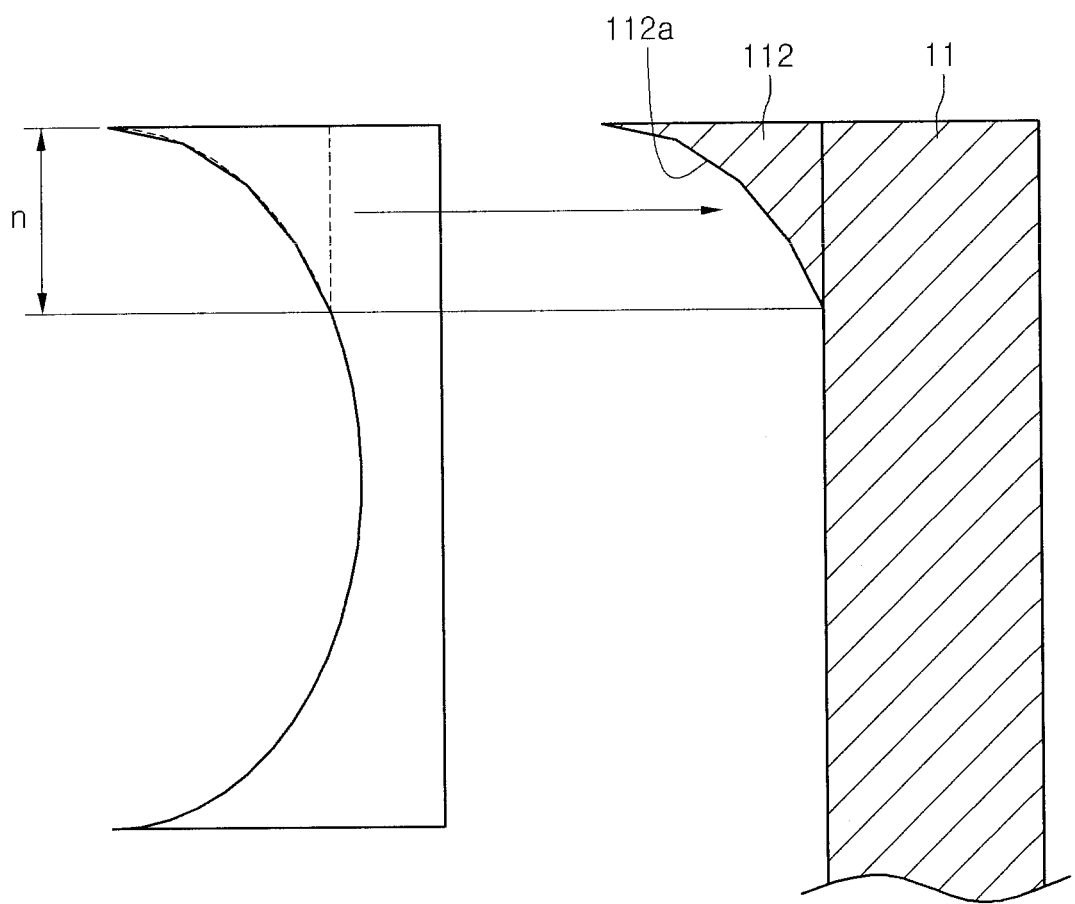
FIG. 16 illustrates an optical path changing part, or refractor, according to another embodiment as broadly described herein.
Figure 17:
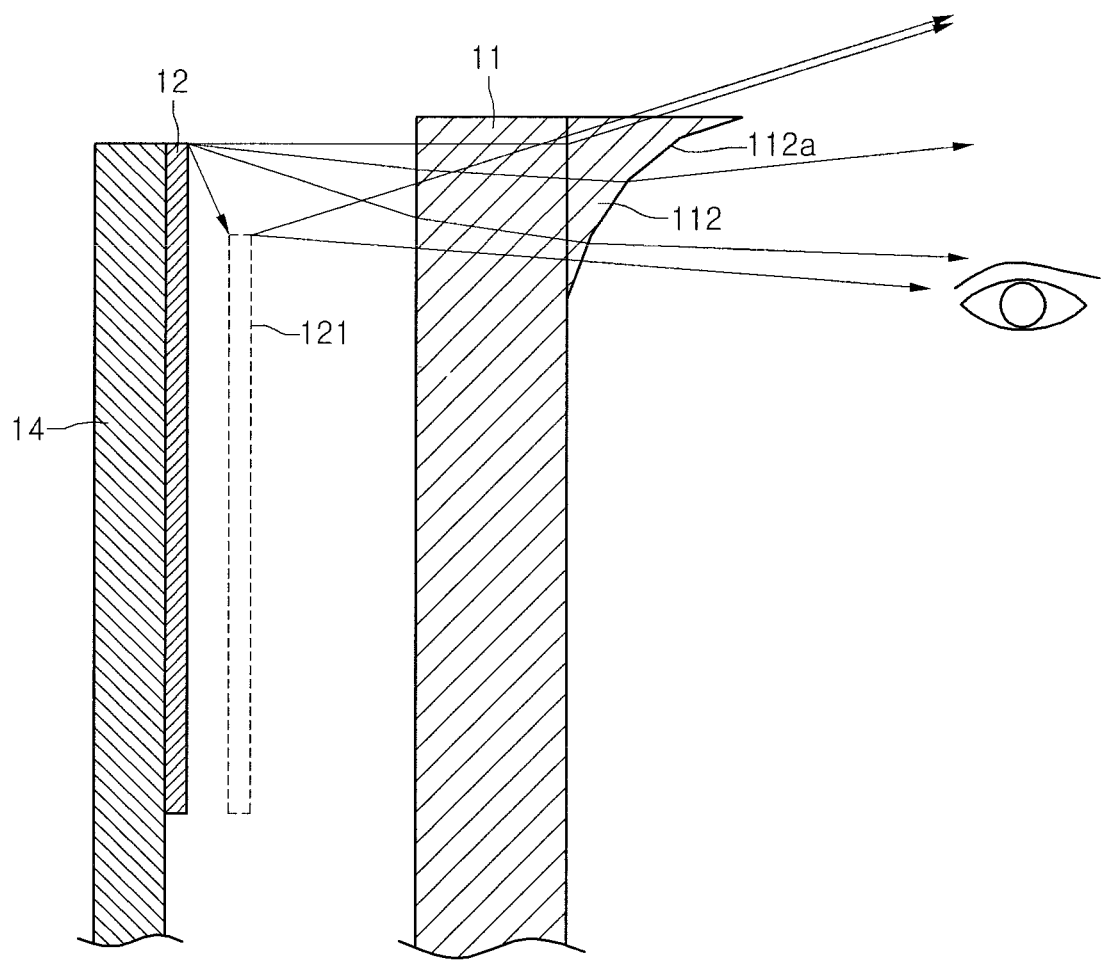
FIG. 17 illustrates an optical phenomenon exhibited when an optical changing part, or refractor, is disposed at the front panel of the display apparatus shown in FIG. 16.

FIGS. 16 and 17 illustrate an optical path changing part, or refractor, and an optical phenomenon that occurs when the optical changing part is disposed at a front panel of a display apparatus according to another embodiment as broadly described herein. The structure of an optical path changing part 112, or refractor, shown in FIG. 16 is slightly different; however, the optical path changing part 112, or refractor, provides essentially the same effects as the optical path changing parts, or refractors, of the previous embodiments. That is, the optical path changing part 112, or refractor, of the embodiment shown in FIG. 16 has a single prism shape with a plurality of refraction surfaces.

In more detail, as shown in FIG. 16, a region (n) of a concave lens to be used for a front panel 11 is selected, and the selected region (n) is divided into a plurality of segments. Then, respective refraction surfaces of the segments are approximately flattened (or linearized). Until this point, the procedures are substantially the same as the procedures for forming the optical path changing parts 111, or refractors, of the previous embodiments.

Next, a single prism is formed, which includes the approximately flattened refraction surfaces of the selected region (n). The region (n) may be established by a vertical line and a horizontal line that pass through the refraction surface of the concave lens. Then, a prism 112 having an approximately triangular shape may be obtained based on a transverse tangent line and a longitudinal tangent line that pass through the refraction surface of the concave lens. A refraction surface 112a of three surfaces of the prism 112 through which light is transmitted is machined so that the refraction surface 112a may be changed from a rounded surface to a multiply bent surface. In this way, the refraction surface 112a of the prism 112 is constituted by continuously arranging a plurality of approximately flattened surfaces (obtained by machining the refraction surface of the concave lens) so as to reduce the chromatic aberration of the prism 112 caused by different wavelengths of light. The angles between a vertical surface and the plurality of approximately flattened surfaces of the refraction surface 112a of the prism 112 increase as they approach the upper end of the prism 112 in FIG. 16. In alternative embodiments, the refraction surface 112a of the prism 112 may have substantially the same curvature as the refraction surface of the concave lens.

The concave lens, which may be used for forming the optical path changing part 111, or refractor, having a prism array shape, or the optical path changing part 112, or refractor, having a single prism shape, may have an elongated shape corresponding to the horizontal and/or vertical width of the front panel 11. In other words, a longitudinal axis of the concave lens (passing through the center of curvature of the concave lens) is parallel with the front side of the front panel 11, and a radial axis of the concave lens passing through the center of curvature of the concave lens is perpendicular to the front side of the front panel 11. In addition, a radial axis of the concave lens passing through the center of the concave lens is aligned with at least a position closer to the inner edge of a non-display region (P) than the outer edge of the non-display region (P), or a position close to an image display region (Q) or located within the image display region (Q).

Referring to FIG. 17, the optical path changing part 112, or refractor, having a prism shape as described above may be provided as part of the front side or rear side of the front panel 11. In alternative embodiments, the optical path changing part 112, or refractor, may be provided in the form of a thin sheet including a film that is attached to the front panel 11. The optical path changing part 112, or refractor, may be provided at a position corresponding to an outer edge region and/or an inner edge region of the shield member 12. In the display apparatus including the optical path changing part 112, or refractor, as shown in FIG. 17, a viewer may experience a similar reduction effect of a non-display region as in the above-described embodiments. Thus, an optical path formed in the case in which the optical path changing part 112, or refractor, having a prism shape is used, and formation of an image of the shield member 12 will not be explained.

As described in the embodiments, an optical path changing part 111/112, or refractor, may be provided on the front or rear side of the front panel 11, at the outer edge and/or inner edge of the non-display region P. In addition, although not shown in the accompanying drawings, the optical path changing part 111/112, or refractor, may be provided on both the front side and rear side of the front panel 11. That is, an optical path changing part 111/112, or refractor, may be provided on the front side of the front panel 11, and another optical path changing part 111/112, or refractor, may be provided on the rear side of the front panel 11 in a case in which the two optical path changing parts 111/112, or refractors, are symmetric with respect to a vertical plane, so as to increase the effect of reducing the width of the non-display region P.

Therefore, a display area may appear to be larger without physically increasing the size of the image display region of the display apparatus. That is, by making the width of the non-display region appear narrower, the image display region may appear relatively larger. Additionally, by actually enlarging the boundary between the image display region and the non-display region, the size of the screen of the display apparatus may be increased.

The embodiment of FIG. 9 includes an optical path changing part, or refractor, on a front side of the front panel, and the embodiment of FIG. 11 includes an optical path changing part, or refractor, on a rear side of the front panel. In alternative embodiments, the embodiments of FIGS. 9 and 11 may be combined so that the front panel includes a first optical path changing part, or refractor, on its front side, and a second optical path changing part, or refractor, on its rear side. Similarly, the embodiment of FIG. 12 includes a pair of optical path changing parts, or refractors on a front side of the front panel, and the embodiment of FIG. 14 includes a pair of optical path changing parts, or refractors, on a rear side of the front panel. In alternative embodiments, the embodiments of FIGS. 12 and 14 may be combined so that the front panel includes a first pair of optical path changing parts, or refractors, on its front side, and a second pair of optical path changing parts, or refractors, on its rear side.

Embodiments provide a display apparatus in which a non-display region is configured to be seen smaller than its actual size so as to make an image display region seem larger.

In one embodiment, a display apparatus as broadly described herein may include a display module configured to output an image; a transparent front panel coupled to a front side of the display module and having an exposed edge portion; a shield member disposed at a rear side of the front panel so as to block an inner component from an outside area except for at least the display module; and a back cover coupled to the rear side of the front panel so as to protect the display module, wherein the front panel is divided into an image display region configured to transmit an image output from the display module, and a non-display region having a predetermined width and defined by the shield member along an edge of the image display region, and wherein optical path changing parts are disposed on a rear side of the front panel at positions corresponding to an outer edge region and an inner edge region of the non-display region, respectively, so as to change an optical path of light.

In another embodiment, a display apparatus as broadly described herein may include a display module configured to output an image; a transparent front panel coupled to a front side of the display module and having an exposed edge portion; and a back cover coupled to a rear side of the front panel so as to protect the display module, wherein the front panel is divided into a transparent region configured to transmit an image output from the display module when the display apparatus is turned on, and an opaque region disposed around the transparent region, wherein optical path changing parts disposed in an entire opaque region to change an optical path of light are disposed at a front side of the front panel, and wherein the optical path changing parts symmetrically extend from an outer edge portion and an inner edge portion of the opaque region to intersect at a certain position.

In another embodiment, a display apparatus as broadly described herein may include a display module configured to output an image; a transparent front panel coupled to a front side of the display module and having an exposed edge portion; and a back cover coupled to a rear side of the front panel so as to protect the display module, wherein the front panel is divided into a transparent region configured to transmit an image output from the display module when the display apparatus is turned on, and an opaque region disposed around the transparent region, wherein optical path changing parts disposed in an entire opaque region to change an optical path of light are disposed at a front side of the front panel, and wherein the optical path changing parts symmetrically extend from an outer edge portion and an inner edge portion of the opaque region to intersect at a certain position.

In another embodiment, a display apparatus provided with a flat panel display module as broadly described herein may include a first changing part configured to change an optical path of light into a first direction; and a second changing part configured to change the optical path of the light into a second direction.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, numerous variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display apparatus, comprising:
a display module configured to output an image;
a front panel provided at a front side of the display module;
a shield layer positioned at a rear side of the front panel;
a back cover coupled to the rear side of the front panel; and
first and second optical refractors provided on a rear side of the front panel, wherein the first optical refractor overlaps an outer edge of the shield layer and the second optical refractor overlaps an inner edge of the shield layer.

2. The apparatus of claim 1, wherein the front panel has an image display region configured to transmit an image output by the display module, and a non-display region that borders an outer periphery of the image display region.

3. The apparatus of claim 2, wherein the first optical refractor is positioned on the rear side of the front panel so as to extend from an outer peripheral edge of the non-display region toward a central portion of the non-display region, and the second optical refractor is positioned on the rear side of the front panel so as to extend from an inner peripheral edge of the non-display region toward the central portion of the non-display region such that the first and second optical refractors meet in the central portion of the non-display region so as to cover the non-display region of the front panel.

4. The apparatus of claim 2, wherein the first and second optical refractors are respectively disposed at an outer edge region and an inner edge region of the non-display region so as to be symmetrical.

5. The apparatus of claim 1, wherein the first and second optical refractors are prism arrays comprising a plurality of prism segments arranged in rows along edge portions of the front panel.

6. The apparatus of claim 5, wherein refraction surfaces of the plurality of prism segments are segments of a rounded refraction surface of a concave lens.

7. The apparatus of claim 5, wherein each of the plurality of prism segments has a refraction surface comprising a corresponding portion of a rounded refraction surface of a concave lens that has been flattened.

8. The apparatus of claim 5, wherein the prism arrays are embossed on the rear side of the front panel so as to protrude from the rear side of the front panel.

9. The apparatus of claim 5, wherein the prism arrays are engraved in the rear side of the front panel.

10. The apparatus of claim 6, wherein a center of curvature of the concave lens is located outside the prism arrays.

11. The apparatus of claim 1, wherein the first and second optical refractors are provided as a single unit with the front panel.

12. The apparatus of claim 1, wherein the first and second optical refractors comprise a thin film attached to the front panel.

13. The apparatus of claim 1, wherein the front panel is formed of poly carbonate (PC) or polymethylmethacrylate (PMMA).

14. The apparatus of claim 1, further comprising an anti-reflection film attached to a front side of the front panel.

15. The apparatus of claim 1, wherein the first and second optical refractors each have a single prism shape with a continuous arrangement of a plurality of segments of a rounded refraction surface of a concave lens that form a refraction surface thereof.

16. The apparatus of claim 1, wherein the first and second optical refractors each have a single prism shape with a plurality of continuously arranged machined segments of a rounded refraction surface of a concave lens each having a substantially flat refraction surface.

17. The apparatus of claim 1, wherein the shield layer is spaced apart from the rear side of the front panel.

18. The apparatus of claim 17, wherein the shield layer comprises a thin sheet made of an opaque film.

19. A display apparatus, comprising:
a display module configured to output an image;
a front panel coupled to a front side of the display module, wherein the front panel comprises a transparent region configured to transmit an image output by the display module, and an opaque region that borders a periphery of the transparent region;
a back cover coupled to a rear side of the front panel; and
first and second optical refractors provided on a rear side of the front panel at positions corresponding to an outer edge region and an inner edge region of the opaque region, respectively.

20. A display apparatus, comprising:
a display module configured to output an image;
a front panel coupled to a front side of the display module, wherein the front panel comprises a transparent region configured to transmit an image output by the display module, and an opaque region disposed around the transparent region;
a back cover coupled to a rear side of the front panel; and
optical refractors provided on the front panel so as to substantially completely cover the opaque region of the front panel and change an optical path of light transmitted therethrough, wherein the optical refractors extend symmetrically from an outer edge portion and an inner edge portion of the opaque region and intersect at a predetermined position within the opaque region.

21. A display apparatus provided with a flat panel display module, wherein the display apparatus comprises:
a first optical refractor configured to direct an optical path of light in a first direction; and
a second optical refractor configured to direct the optical path of the light in a second direction,
wherein the first and second optical refractors are provided in an opaque region extending along edge portions of the front layer, at an outer edge portion and an inner edge portion of the opaque region, respectively.

22. The apparatus of claim 21, wherein the first and second optical refractors are provided on a rear side of a front layer that is coupled to a front side of the display module.

23. The apparatus of claim 22, wherein the first and second optical refractors are prism arrays configured to refract light incident on a rear side of the front layer toward a front side of the front layer.

24. The apparatus of claim 21, wherein the first and second optical refractors are concave Fresnel lenses configured to change an optical path of light such that a perceived size of the opaque region of the front layer is less than an actual size thereof.

25. The apparatus of claim 21, wherein the first and second optical refractors are symmetrical to each other.

* * * * *